July 13, 1965 B. E. SEAR 3,194,983

LOGIC CIRCUIT EMPLOYING CURRENT SELECTIVELY CONTROLLED FOR SWITCHING TUNNEL DIODE

Filed Feb. 13, 1962 2 Sheets-Sheet 1

INVENTOR
BRIAN ELLIOTT SEAR

BY G. Donald Weber, Jr.
AGENT

July 13, 1965 B. E. SEAR 3,194,983

LOGIC CIRCUIT EMPLOYING CURRENT SELECTIVELY CONTROLLED FOR SWITCHING TUNNEL DIODE

Filed Feb. 13, 1962 2 Sheets-Sheet 2

United States Patent Office 3,194,983
Patented July 13, 1965

3,194,983
LOGIC CIRCUIT EMPLOYING CURRENT SELECTIVELY CONTROLLED FOR SWITCHING TUNNEL DIODE

Brian Elliott Sear, Oreland, Pa., assignor to Sperry Rand Corporation, New York, N.Y., a corporation of Delaware Filed Feb. 13, 1962, Ser. No. 173,096
6 Claims. (Cl. 307—88.5)

This invention relates to diode coupled logic circuits. More particularly, the invention relates to diode coupled tunnel diode AND and OR logic circuits as well as complementary combinations thereof.

In the past, tunnel diode circuits have been used in logic circuits as well as other switching circuits. Generally a plurality of these tunnel diode circuits have been coupled together via a coupling impedance. The coupling impedances have been generally of the fixed value type whereby load current and input current was dependent on the value of the coupling impedance as well as the magnitude of the high state voltage of the preceding stage. Inasmuch as the coupling impedance was substantially constant in value and capable of passing current in either direction the input circuit could present a heavy load on the circuit. Moreover, inasmuch as the high stage voltage of a tunnel diode can easily vary by 20% depending upon the output load requirement, the succeeding stage may have different voltages applied thereto for different loading conditions. Clearly, this type of operation is undesirable.

In the instant invention, tunnel diode circuits are provided with coupling means comprising unilateral conducting devices, for example diodes, whereby an effective open circuit or high impedance load is presented by the input of each stage. Therefore, the only load current which may flow is M times a constant current where M denotes the number of outputs derived from the stage and the constant current is supplied via a biasing source, and these quantities can be precisely defined. Moreover, the biasing source which provides the constant current includes the clocking arrangement and effectively defines the input current to the circuit. Thus, a tunnel diode is connected to perform either an AND or an OR logic function. That is, the inputs are coupled to one electrode of the tunnel diode via a unilateral conductive device and the outputs are also derived from this electrode of the tunnel diode. The other electrodes of the respective tunnel diodes are clamped to predetermined potentials in order to maximize the operation of the circuit as well as to determine the specific logic function performed. Set clock and reset clock signals are supplied to an electrode of the tunnel diodes to control the switching thereof. The set clock source supplies a potential in conjunction with other biasing potentials such that the tunnel diodes resides in the low voltage operating condition until a set clock signal is supplied whereupon the tunnel diode may or may not switch in accordance with the input signal information supplied thereto. It will be seen, that this circuit configuration permits fairly wide tolerances on $I_P$, $I_B$ and $I_R$ where $I_P$ is the peak current, $I_B$ is the bias current, and $I_R$ is the clock or input current supplied to the tunnel diode. The circuits and systems utilizing these circuits are designed to be compatible with the NOR circuit described in the copending patent application entitled "Logic Circuit" by Brian E. Sear and Jack S. Cubert, filed on February 13, 1962, bearing Serial Number 720,937 and assigned to the assignee of the instant application.

From the preceding, it will be seen that one object of this invention is to provide high speed logic circuits using tunnel diodes.

A further object of this invention is to provide simple, high speed, tunnel diode AND-OR circuits with wide circuit tolerances on tunnel diode parameters and associated circuitry.

Another object of this invention is to provide tunnel diode logic circuits which can be used in conjunction with threshold logic and in logic where clocking signals are based on logical decisions.

Another object of this invention is to provide tunnel diode logic circuits which have good input-output isolation whereby a large fan-in is permitted.

Another object of this invention is to provide a tunnel diode logic circuit wherein fan-out is not restricted by variations in the tunnel diode high state voltage.

These and other objects and advantages of this invention will become more readily apparent and subsequent to a review of the following description in conjunction with the drawings attached hereto in which.

Figure 1A:
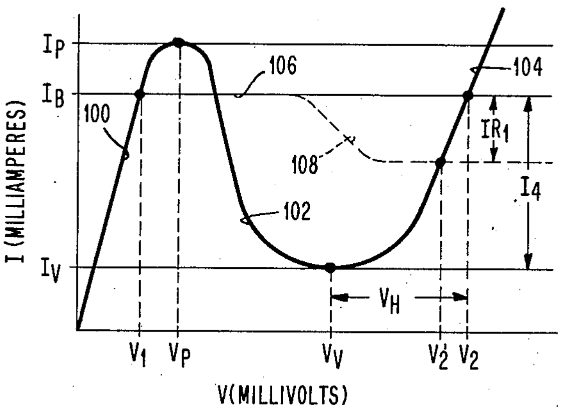
FIGURES 1A through 1C represent typical V–I characteristics for the non-linear components utilized in said circuits.

Referring now to FIGURE 1A, there is shown a typical V–I characteristic for a tunnel diode such as may be used in the circuit which is the subject of the instant invention. This characteristic is of the conventional well-known type of characteristic and includes the low voltage operating condition 100, the high voltage operating state 104, and the negative resistance region 102. The peak current is designated by the reference $I_P$ and the valley current is designated by the reference $I_V$. Similarly, the peak voltage is designated by reference $V_P$ and the valley voltage is designated by the reference $V_V$. These references are well known in tunnel diode art. Normally, a tunnel diode is biased to a particular operating condition. This is represented by the steady state load line designated by the reference $I_B$. Depending upon the type of operation of the circuit in which the tunnel diode is connected, the bias load lines 106 may be nearer to $I_P$ than to $I_V$ or vice versa. In a typical application, the load line $I_B$ may have a value on the order of $0.7I_P$. The load line 106 is the load line when the circuit is the steady state operating condition and in the no-load condition. When an output load is connected to the tunnel diode, the load line shifts as is graphically represented by dotted load line 108. This shift in the load line is produced inasmuch as the load current designated as $I_{R1}$ is drawn by the load. This current is not identical to the bias current $I_B$. It will be seen that the voltage supplied by the tunnel diode when operating in the high voltage operating condition shifts from $V_2$ to $V_{2'}$, when load current is drawn. Thus, it will be seen that the potential at the output of the tunnel diode circuit may be varied. This variation may be termed $\Delta V_H$ where $V_H$ is defined as the difference between the $V_V$ and $V_2$. Inasmuch as $\Delta V_H$ varies as shown, it is desirable to minimize the number of extraneous loads which drain current from the tunnel diode circuit. Consequently, the circuit of the instant invention has been devised to avoid this problem.

Figure 1B:
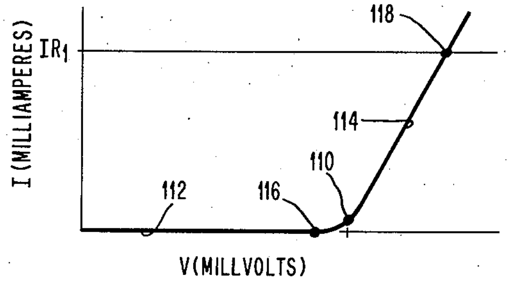

Referring now to FIGURE 1B there is shown a typical V–I characteristic for a diode which may be used in the circuit. The V–I characteristic for a diode is well-known in the art. Thus, there is the low conduction region 112 and the high conduction region 114 which are effectively joined at the break-point 110. Thus, when the diode is biased below the break-point 110, as for example at operating point 116, little or no current flows therethrough; on the contrary, when the diode is biased at operating point 118, a substantial amount of current may be passed through the diode. Also shown in FIGURE 1B, is the particular designation of the current $I_{R1}$. This current was shown in FIGURE 1A to be the load current required to be produced by the tunnel diode circuit and to be supplied to a single load. Further load current requirements may be understood to be represented by load lines (not shown) between load line 108 and line $I_V$. Clearly, this current requires that the diode be biased to the high conducting region with a potential $V_2$ thereacross whereby the diode operates at operating point 118.

Figure 1C:
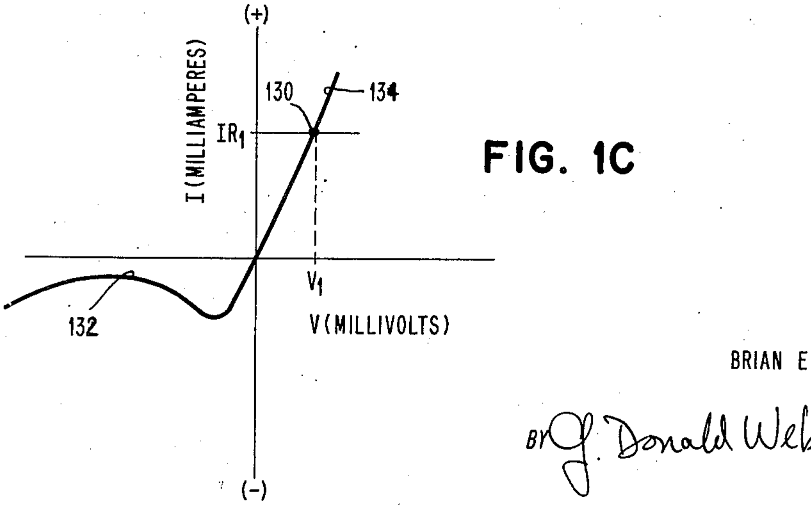

Referring now to FIGURE 1C, it will be seen that there is shown a typical V–I characteristic for a backward diode. A description of backward diodes may be found in the "Tunnel Diode Manual" which is made available by General Electric Company. Briefly, the backward diode may be considered to be a tunnel diode which is connected to the circuit in the reverse direction whereby a large current flows and increases continuously as the voltage thereacross increases. That is, a backward diode has a lower forward voltage drop at a given current than a conventional diode. Moreover, a backward diode may be considered to be a very low impedance circuit device. The characteristic shown in FIGURE 1C may be considered as being a tunnel diode characteristic which has been rotated 180°. That is, the V–I characteristic shown in FIGURE 1A has been switched to the third quadrant and the reverse characteristics of the tunnel diode which accompany the characteristics shown in FIGURE 1A (but which reverse characteristics is not shown) is switched to the first quadrant. Thus the tunnel diode characteristic is shown generally as line portion 132 in FIGURE 1C and the reverse characteristic is shown generally as line 134 in FIGURE 1C. However, the so-called reverse region 134 is now the forward characteristic inasmuch as the backward diode is connected into the circuit in reversed polarity. The operating point 130 is the point where the backward diode operates when a current $I_{R1}$ is supplied thereto.

Figure 2:
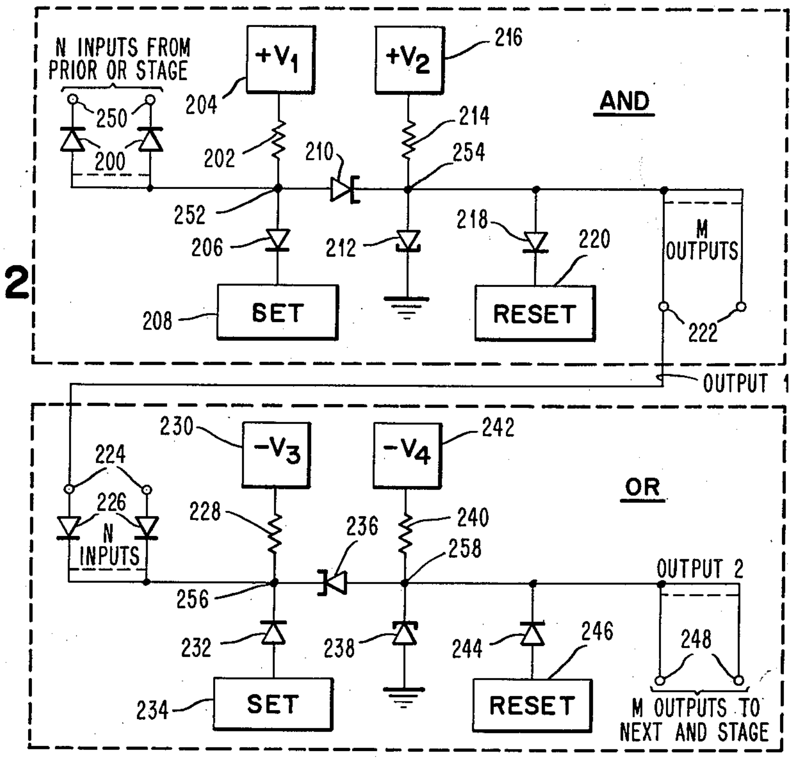
FIGURE 2 is a schematic drawing of one embodiment of this invention.

Referring now to FIGURE 2, there is shown a schematic diagram of complementary AND-OR circuits. The AND logic circuit and the OR logic circuit are each separate and distinct circuits. However, each of these circuits utilizes the same inventive principle and operates along substantially similar lines. The distinction in the operation is that the AND stage typically requires that all of the inputs be high level signals in order to produce a high level output signal. The OR circuit, on the other hand, requires only that one of the inputs be a high level signal in order to produce a high level output signal. Moreover, even though the AND and the OR stages are shown together in FIGURE 2, it is to be understood that each of these circuits will operate as described infra, when taken individually.

In particular, FIGURE 2 shows N input diodes 200. These diodes are so poled that the cathodes thereof are connected to input terminals 250 which may represent for example, an OR circuit similar to that also shown in FIGURE 2. The anodes of input diodes 200 are connected together and to one terminal of resistor 202 at common junction 252. Another terminal of resistor 202 which may be on the order of 1500 ohms is connected to potential source 204. Potential source 204 may be any of the conventional source types which is capable of providing a potential on the order of about +10 volts. Also connected to the anodes of diodes 200 and to one terminal of resistor 202 is the anode of diode 206. The cathode of diode 206 is connected to the set clock pulse source 208. The set clock source 208 may be any type of conventional clock source capable of supplying a halfwave rectified sine wave, for example, which is D.C. biased so as to provide a base line having a potential of about −500 millivolts and a peak magnitude on the order of +500 millivolts. A high frequency clock pulse source which may be utilized in conjunction with this circuit is described in the copending application Serial Number 152,338 entitled "High Frequency Pulse Generator" by T. K. Lewis and assigned to the assignee of the instant invention which patent application was filed on November 14, 1961. The clock source is utilized to provide a sampling of the input diodes 200 to determine the level of the input signal. Also connected to common junction 252, is the anode of backward diode 210. A typical backward diode might be a G.E. ZJ722 diode. The V–I characteristic for the backward diode is discussed supra in conjunction with FIGURE 1C. The cathode of backward diode 210 is connected to common junction 254. Also connected to the common junction 254 is the anode of tunnel diode 212 which has the cathode thereof connected to ground. One tunnel diode which could be utilized may be, for example, an RCA type 1N3129 tunnel diode which has an $I_P$ of about 20 milliamperes. Resistor 214 which may be on the order of 700 ohms has one terminal thereof connected to common junction 254 and another terminal thereof connected to potential source 216. Potential source 216 may be any conventional source which is capable of supplying a substantially constant potential of about +10 volts. Potential sources 204 and 216 may, in actuality, comprise a single source. The reset diode 218 has the anode thereof connected to common junction 254. The reset diode 218 as in the case of all other diodes described both in the AND and in the OR circuits may be Qutronics type ID5–050 diodes. The cathode of reset diode 218 is connected to reset clock source 220. The reset source may be any source similar to the set clock source 208 which is capable of providing a base line potential on the order of +500 millivolts and a periodic pulse having a peak magnitude on the order of −500 millivolts. This reset network is utilized to reset the tunnel diode 212 to the low voltage operating condition as will be described infra. Shown connected to the common junction 254 are the M output terminals 222 where output signals from the AND circuit are derived. Though only two output lines are shown, it is to be understood that the number of M outputs is to be determined only by the load current available from tunnel diode 212 which output current is determined by the type of diode and the operating parameters as described in conjunction with FIGURE 1A. Moreover, for convenience, one of the output diodes from the AND circuit is labeled as output 1. This output is the line on which the output 1 signal of FIGURE 3 is produced.

An OR circuit shown in FIGURE 2 has N input terminals 224. The N inputs are not limited to two terminals as shown. The input terminals 224 are connected to the anodes of diodes 226 which are input diodes or, in this case, coupling diodes. The cathodes of the input diodes are connected together and to common junction 256. Resistor 228 which may be a 1500 ohm resistor has one terminal thereof connected to common junction 256. Another terminal of resistor 228 is connected to potential source 230. Potential source 230 may be any conventional potential source which is capable of providing a substantially constant potential of about −10 volts. Also connected to common junction 256 is the cathode of set diode 232. The anode of diode 232 is connected to the set clock source 234 which may be any conventional type of source which provides a base potential on the order of +500 millivolts and a periodic pulse which has a peak magnitude on the order of −500 millivolts. The cathode of backward diode 236 is also connected to common junction 256. The anode of backward diode 236 is connected to common junction 258. Also connected to common junction 258 is the cathode of tunnel diode 238 which has the anode thereof returned to ground. Tunnel diode 238 may also be an RCA type 1N3129 tunnel diode. One end of biasing resistor 240 which may be on the order of 700 ohms is connected to common junction 258. Another terminal of resistor 240 is connected to potential source 242 which may be any conventional potential source capable of supplying a substantially constant potential of about −10 volts. Moreover, the potential sources 230 and 242 may, in actuality, comprise the same potential source. Reset diode 244 has the cathode thereof connected to common junction 258. The anode of reset diode 244 is connected to the reset clock source 246 which may be any conventional clock source capable of providing a base line potential on the order of −500 millivolts and a periodic pulse having a peak magnitude on the order of +500 millivolts. Once again, set source 234 and reset source 246 may be half wave rectified sine waves or in the alternative, they may comprise a high frequency generator as described in the copending application of T. K. Lewis cited supra or the like. The output terminals 248 are also connected to common junction 258. It is to be understood of course, that the M outputs are not limited to the two output terminals 248 that are shown. Again, as in the case of the AND circuit, the number of outputs which can be driven by the OR circuit are dependent upon the current supplying capabilities of tunnel diode 238. The output 2 signal which is shown in FIGURE 3 is derived from one of the output terminals 248 shown in FIGURE 2 and consequently, these terminals are so labeled. The output 2 signal is shown being connected to an AND circuit. This circuit description is meant to be illustrative and not limitative. It is to be understood that other circuits can be utilized therewith including the NOR circuit of Sear and Cubert, cited supra.

Figure 3:
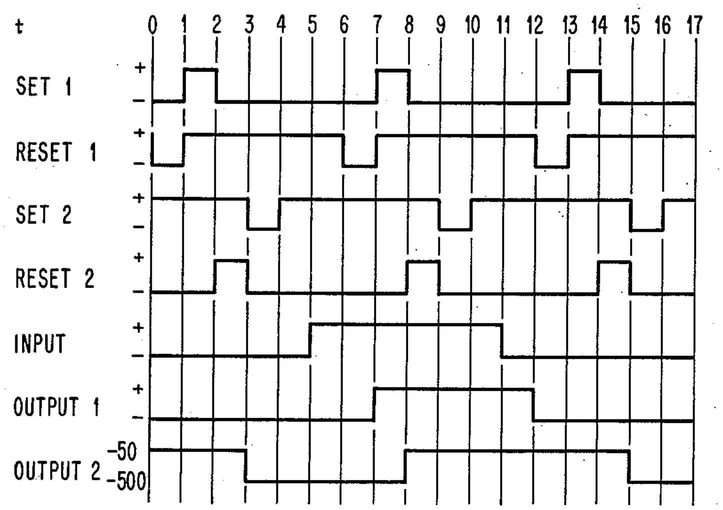
FIGURE 3 shows an idealized timing diagram for the embodiment shown in FIGURE 2.

The operation of the circuits shown in FIGURE 2 is more easily understandable when discussed in terms of the timing diagrams shown in FIGURE 3. In FIGURE 3, the waveforms are shown as square pulses. It is to be understood, of course, that these pulses which are idealized waveforms, show instantaneous rise and fall times and suggest instantaneous response of all components. Clearly the operation of the circuit is not limited to the application of such signals nor is the response necessarily exactly as produced in practical implementations. However, the underlying operational precepts are easily gleaned from the diagrams as shown. The set 1 and reset 1 signals are the set and reset signals for the AND gates. Similarly, the set 2 and reset 2 signals are the set and reset signals applied to the OR gate. The input signal is an arbitrary signal which is supplied to input terminals 250 of FIGURE 2. The output 1 and output 2 signals are derived from the points designated in FIGURE 2. Moreover, it is to be understood that the plus and minus symbols (+, −) associated with each waveform are not indicative, necessarily, of polarity of the signal but rather are indicative of high and low level signals.

At time period $t0$, the input signal is a low level signal. In the illustration given, a low level signal is a signal on the order of −500 millivolts. Thus, the potential at the cathodes of input diodes 200 is on the order of −500 millivolts. Moreover, the reset 1 signal is a low level signal or a −500 millivolt signal whereby the tunnel diode 212 is reset to the low voltage operating condition such that the potential at the anode thereof is on the order of +50 millivolts. When the reset 1 signal switches high or +500 millivolt signal, the potential at the anode of tunnel diode 212 remains at the low level. That is, the application of the −500 millivolt signal to the cathode of input diodes 200 causes said diodes to be forward biased. Inasmuch as there is a potential drop thereacross on the order of 250 millivolts, common junction 252 resides at a potential of about −250 millivolts. Inasmuch as the anode of tunnel diode 212 is reset to the +50 millivolt level, backward diode 210 is reverse biased and cutoff. Consequently, current cannot flow through backward diode 210. Thus, the bias current $I_B$ which is on the order of 14 milliamperes flows from source 216, through resistor 214 and tunnel diode 212 to ground. Likewise, a current on the order of 6 milliamperes flows from source 204 through resistor 202 and diode 206 to source 208. As previously described, the 14 milliampere current flow through tunnel diode 212 is insufficient to drive said tunnel diode to the high voltage operating condition.

When the set 1 signal siwtches to the high level at time period $t1$, a potential of about +500 millivolts is supplied to the cathode of diode 206. Inasmuch as common junction 252 is effectively clamped at the −250 millivolt potential by the −500 millivolt potential applied to input diodes 200, diode 206 is back-biased. However, current which previously passed through diode 206 now passes through the input diodes 200.

At time period $t5$, the arbitrary input signal switches from the low to the high level. That is, the potential applied to input terminals 250 switches to a potential of about −50 millivolts. The reset 1 signal supplied to the circuit at time period $t6$ has no effect inasmuch as tunnel diode 212 already resides in the low voltage operating condition since, theoretically, the 6 milliampere and 14 milliampere currents flow through the circuit paths previously described. With the application of the set 1 pulse at time period $t7$, the potential at the cathode of diode 206 switches to +500 millivolts. Since the cathodes of input diodes 200 are now effectively clamped at −50 millivolts, the anode of diode 206 and the common junction 252 attempt to rise toward the potential of about +750 millivolts (i.e. the +500 millivolt signal applied to the cathode of the diode plus the 250 millivolt forward drop thereacross). However, the cathode of backward diode 210 is effectively clamped at +50 millivolts. Assuming the forward drop across the backward diode is on the order of 50 millivolts, the backward diode 210 will begin to conduct when the potential at common junction 252 approaches +100 millivolts. It will be seen that the diode 206 is rendered back-biased by the potentials supplied to the anode thereof. Thus, it can be seen that the diode paths comprising diodes 200 and 206 are cut off. Consequently, the current produced by source 204 via resistor 202 now flows through backward diode 210 to tunnel diode 212. This current (of about 6 milliamperes) and the bias current (of about 14 milliamperes) produces a current having the sum of approximately 20 to 21 milliamperes which passes through tunnel diode 212 and is sufficient to switch the tunnel diode from the low voltage operating condition to the high voltage operating condition. When the tunnel diode switches to the high operating condition, the potential at the anode thereof switches to +500 millivolts. Thus, the output 1 signal is shown as switching to the high level at time period $t7$.

The ouput 1 signal is applied to the OR circuit and is to be treated as the input signal thereof. Thus, the low level input signal to the OR circuit is a +50 millivolt signal and the high level signal is a +500 millivolt signal. Inasmuch as the output signals applied by the OR circuit are somewhat indeterminate between time period $t0$ and $t2$, it is shown as a high level signal. In this case the high level signal is a −50 millivolt signal as opposed to the low low level or −500 millivolt signal supplied by the OR circuit. At time period $t2$, the reset 2 signal switches to the +500 millivolt level thereby causing tunnel diode 238 to switch to the peak operating condition whereby the voltage drop thereacross is on the order of 50 millivolts. When operating in this condition, the tunnel diode assures that the potential at the anode thereof (common junction 258) is on the order of −50 volts (i.e. a 50 millivolt drop from the reference ground potential). Thus, a 14 milliampere bias current flows through tunnel diode 238 where this bias current is defined by resistor 240 and potential source 242. Likewise, it is assumed that a 6 milliampere current flows through diode 232, resistor 228 to potential source 230 where this current is defined by source 230 and resistor 228. With the application of the set 2 signal at time period $t3$, a potential of about −500 millivolts is applied to the anode of diode 232. Inasmuch as the anode of input diodes 226 is clamped to +50 millivolts, common junction 256 attempts to follow the set 2 pulse. The potential at common junction 256 would tend to switch to —750 millivolts (i.e. the —500 millivolt potential supplied to the anode of diode 232 plus the 250 millivolt drop thereacross). However, when the junction 256 approaches a —100 millivolt potential, backward diode 236 is rendered conductive. That is, backward diode 236 exhibits a 50 millivolt forward drop thereacross and common junction 258 is clamped at approximately —50 millivolts. Inasmuch as input diodes 226 and set diode 232 are now cutoff, the current required by the substantially constant current source comprised of potential source 230 and resistor 228 must be supplied by the tunnel diode 238 and backward diode 236. Thus, in addition to the 14 milliampere bias current drawn in conjunction with potential source 242 and resistor 240, the current of approximately 6 milliamperes required by the constant current source previously described must now also pass through tunnel diode 238. In accordance with well known current calculating laws, these currents are additive and the current flowing through tunnel diode 238 is on the order of 20 to 21 milliamperes. This current is predetermined to be sufficient to switch the tunnel diode to the forward voltage operating region. When in the forward voltage operating region, the potential drop across the tunnel diode 238 approximates 500 millivolts. Consequently, the cathode (and junction 258) will exhibit a potential on the order of —500 millivolts. Therefore, the output 2 signal switches from the —50 to the —500 millivolt level at time period *t*3. With the application of the reset 2 signal at time period *t*8, a +500 millivolt signal is applied to the anode of the diode 244 whereby the cathode of this diode exhibits a potential on the order of +250 millivolts. This reset signal causes tunnel diode 238 to switch from the forward voltage operating region to the peak operating region. This resetting of the tunnel diode may be considered to be on the basis of reducing the potential drop thereacross below the valley voltage or in the alternative of supplying sufficient current to the load 248 such that the current drawn through the tunnel diode drops below the valley current $I_V$. In any event, the output signal switches from the —500 to the —50 millivolt level at time period *t*8.

It will be noticed that the output 1 signal (the input signal to the OR stage) switches from the +50 to the +500 millivolt level at time period *t*7. Consequently, when the set 2 signal is applied to the OR stage at time period *t*9, the common junction 256 is effectively clamped at +250 millivolts by the input signal. Thus, diode 232 is back-biased. Moreover, backward diode 236 is also back-biased and cutoff. Therefore, the current flow to source 230 is supplied via input diodes 226. Inasmuch as backward diode 236 is cutoff, the current flow through tunnel diode 238 remains at the 14 milliampere current and the tunnel diode is not switched to the forward voltage operating region. Consequently, the output 2 signal remains at the —50 volt level after the application of set 2 signal at time period *t*9.

Once again the output 1 (input 2) signal switches to the low or +50 millivolt level at time period *t*12. This signal switch has no effect on the system inasmuch as the set source 234 continues to apply a —500 millivolt signal via diode 232. Likewise, the reset 2 signal applied at time period *t*14 has no effect on the output 2 signal inasmuch as tunnel diode 238 has remained reset in the low voltage operating condition. With the application of the set 2 signal at time period *t*15, the circuit operates as previously described with respect to time period *t*3 and the tunnel diode 238 must pass excess current through backward diode 236 whereby tunnel diode 238 is switched to the forward voltage operating condition and the output 2 signals switch from the —50 to the —500 millivolt level.

There has thus been described an AND logic circuit and an OR logic circuit. Each of these circuits has been described in such a way that the AND-OR logic circuits are complementary in function. That is, the outputs from the AND circuit may be supplied to the input terminals of the OR circuit and vice versa. It is clear, of course, that a cascaded network utilizing these AND and OR circuits is contemplated and is within the principles shown and described relative to FIGURE 2.

It should be understood that the NOR logic circuit previously cited as a copending application of J. S. Cubert and B. E. Sear may be utilized with this network. This combination of AND, OR and NOR logic circuits may be utilized in providing a complete logic circuit component for a computing machine, many of which are known in the art.

It should be clear that, as usual, the specific components and component values suggested supra are meant to be illustrative only and are not meant to be limitative of the invention. Rather specific suggestions are meant to be utilized in the description of a preferred teaching of the inventive concepts involved. A modification of any of these components is permissible in the teachings supra so long as the basic invention as covered by the appended claims is not materially altered.

Having thus described the invention what is claimed is:

1. A logic circuit comprising, a first current source, a second current source, a tunnel diode connected to said second current source such that bias current flows in said tunnel diode, input means adapted to have signals applied thereto, reference means connected to said first current source such that a substantially constant current is produced, said input means connected to said first current source, coupling means connected between the connection of said first current source and said input means and said tunnel diode, said coupling means exhibiting different conducting capabilities in accordance with the application of different signals to said input means, and control means connected to said first current source and to said reference means connected to said first source to selectively cause current flow in said input means or in said coupling means mutually exclusively in accordance with the application of different signals to said input means.

2. The logic circuit of claim 1 wherein said control means includes a unilaterally conducting device connected between said first current source and said reference means, and a control pulse source which selectively reverse biases said unilaterally conducting device such that said first current source and said reference means are disconnected.

3. The logic circuit of claim 1 wherein said coupling means comprises a backward diode.

4. A digital logic circuit comprising, a tunnel diode having a pair of electrodes, said tunnel diode exhibiting at least first and second operating states, first, second and third current paths, input means connected to said first current path, a backward diode having a pair of electrodes and connected to said second current path, one electrode of said backward diode connected to one electrode of said tunnel diode, another electrode of said backward diode connected to said input means via said first current path, first current source means, second current source means, said first current source means connected to said tunnel diode to provide bias current therethrough, said second current source means connected to said first, second and third current paths to supply a substantially constant current thereto alternatively, and means for supplying periodic current pulses connected to said third current path, said first current path being selectively inhibited by the application of input signals to said input means, said third current path being selectively inhibited by the application of said periodic current pulses, said constant current supplied by said second source being supplied to said tunnel diode via said second current path and in addition to said bias current such that said tunnel diode is switched from said first to said second operating state only in response to the simultaneous inhibition of said first and third current paths by the application of signals to said input means and pulses by said means for supplying periodic current pulses.

5. A logic circuit comprising, a tunnel diode having a pair of electrodes, said tunnel diode exhibiting at least first and second operating states, input means adapted to have input signals applied thereto, a backward diode having a pair of electrodes, one electrode of said backward diode connected to said input means, first current source means, and second current source means, said first current source means connected to said tunnel diode to provide bias current therethrough, said second current source means connected to said input means and said backward diode, said second current source means providing a substantially constant current, and means for applying periodic current pulses for alternatively diverting said substantially constant current from said second current source to said input means in the absence of the application of input signals to said input means and to said tunnel diode when said input means is blocked by the application of input signals, said tunnel diode being switched from said first to said second operating state only in response to the application of signals to said input means and the application of said periodic current pulses simultaneously.

6. A logic circuit comprising, a tunnel diode having a pair of electrodes, said tunnel diode exhibiting at least first and second operating states, input means adapted to have input signals applied thereto, a backward diode having a pair of electrodes, one electrode of said backward diode connected to said input means, first current source means, and second current source means, said first current source means connected to said tunnel diode to provide bias current therethrough, said second current source means connected to said input means and said backward diode, said second current source means providing a substantially constant current, means for applying periodic current pulses for alternatively diverting said substantially constant current from said second current source to said input means in the absence of the application of input signals to said input means and to said tunnel diode when said input means is blocked by the application of input signals, said tunnel diode being switched from said first to said second operating state only in response to the application of signals to said input means and the application of said periodic current pulses simultaneously, output means connected to said one electrode of said tunnel diode, and reset means connected to said tunnel diode to switch said tunnel diode from said second to said first stable operating state.

References Cited by the Examiner

UNITED STATES PATENTS

| | | | |
|---|---|---|---|
| 3,114,846 | 12/63 | Pressman | 307—88.5 |
| 3,119,935 | 1/64 | Samusenko | 307—88.5 |
| 3,125,689 | 3/64 | Miller | 307—88.5 |

OTHER REFERENCES

Proceedings of the IRE, September 1961, "A Bistable Flip-Flop Circuit Using Tunnel Diode."

Philco Corporation Application Lab. Report 681, December 1960, "Basic Digital Application of the T1925 and T1975 Tunnel Diodes."

Publication one of a series "Tale of The Hoffman Uni-Tunnel Diode—or, How Low Can You Get? Copyright December 1960, by Hoffman Electronics Corporation, pages 8, 9 and 41.

ARTHUR GAUSS, *Primary Examiner.*

JOHN W. HUCKERT, *Examiner.*